United States Patent [19]

Chang et al.

[11] 4,082,602
[45] Apr. 4, 1978

[54] PHOTOVOLTAIC CELL MANUFACTURE

[75] Inventors: Kuang-Chou Chang, North Plainfield; Adam Heller, Bridgewater; Barry Miller, Murray Hill, all of N.J.

[73] Assignee: Bell Telephone Laboratories, Incorporated, Murray Hill, N.J.

[21] Appl. No.: 792,580

[22] Filed: May 2, 1977

[51] Int. Cl.² .......................................... H01L 21/306
[52] U.S. Cl. .................................. 156/627; 156/655; 156/662
[58] Field of Search ........ 156/626, 627, 642, 654–657, 156/662; 29/574; 429/111; 356/213, 218, 226; 324/76 R, 77 K, 96

[56] References Cited

U.S. PATENT DOCUMENTS 3,150,021  9/1964  Sato ..................................... 156/627
3,874,959  4/1975  Hoekstra et al. ..................... 156/627
4,039,370  8/1977  Kleinknecht ......................... 156/626

*Primary Examiner*—William A. Powell
*Attorney, Agent, or Firm*—Richard D. Laumann

[57] ABSTRACT

A quality control technique is based on the observation that trapping centers contribute to inefficient operation of junction devices. Devices are irradiated by a first radiation source of intensity sufficient to populate traps and a second radiation source of varying wavelength. Trapping centers are detected by a deviation from the expected photovoltaic output-incident wavelength relationship. Such "structure" is utilized as the basis for altering production conditions to minimize currents of such centers. While the procedure is of general applicability, it is particularly suitable as applied to photovoltaic cells.

13 Claims, 10 Drawing Figures

PHOTOVOLTAIC CELL MANUFACTURE

BACKGROUND OF THE INVENTION

1. Field of the Invention

The invention is concerned with production line quality control of semiconductor junction devices. The category of applicable devices includes those containing homojunctions, heterojunctions, those in which the junction is formed between semiconductor materials, semiconductors and metals, as well as semiconductors and ionic liquids.

2. Description of the Prior Art

The applicability of semiconductor junction devices for many uses was perceived as a value virtually with the inception of such devices. The earliest literature on germanium and silicon homojunction single crystal devices alludes to photocurrents and to the possibility of using such structures as primary power supplies. In fact, commercial fruition of single crystal photocells, generally in relatively low power devices, was attained some years ago; and relatively sophisticated circuitry requiring such low power, for example, in satellite-born equipment, has been used for some time.

Early and continued interest in the possible use of junction devices as primary power supplies at higher power levels is evidenced by the numerous articles on this topic published in a variety of technical journals over the years. This interest has recently been intensified by general concern with the future availability of fossil fuel. Visualizing the desirability of responsive, large area devices, intensified interest has been directed toward polycrystalline rather than single crystal devices. While such polycrystalline devices may depend upon homojunctions, improved flexibility in device operation (e.g., tailored transparency to incident radiation on the irradiated side of a junction with efficient absorption on the other), and other considerations, including some concerned with manufacturing expediency, have largely dictated the use of heterojunctions. Heterojunctions of interest have taken the form of semiconductor-semiconductor structures and, perhaps, most significantly, of semiconductor-liquid junction structures (see *Journal of Electroanalytical Chemistry*, 58 (1975) 263 by H. Gerischer).

At this time, it is generally accepted by workers in the field that the large area devices contemplated for generation of significant amounts of power will necessarily contemplate use of polycrystalline layers. To date, the various polycrystalline devices reported share an operating deficiency—a marked decrease in photo conversion efficiency as compared with single crystal homojunction devices. Typically, polycrystalline devices reported have operated at efficiencies less than several percent as compared with the ten to fourteen percent range regularly attainable in a traditional silicon solar cell.

It is generally recognized that a cause of the relative inefficiency of polycrystalline devices as compared to single crystal devices is the recombination of photogenerated carriers at grain boundaries or structural defects. Some trapping mechanisms are, as recognized, avoidable by techniques such as appropriate material choices, properly engineered fabrication, etc. Other trapping mechanisms are concerned with factors such as simple lattice mismatches, differences in thermal expansion, contamination, etc., which are avoidable by conventional approaches. Appropriate material selection and processing steps, such as surface etching, have resulted in improved efficiency. It has become evident, however, that the effective processing expedients contribute to the complexity of fabrication and create a need for accurate quality control.

The trapping mechanisms discussed above are, of course, of concern in junction devices generally regardless of the intended purpose of such devices and quality control procedures which may be usefully employed as a basis for monitoring processing conditions to insure minimization of trapping centers are therefore of general interest.

SUMMARY OF THE INVENTION

The invention is concerned with production line quality control of junction devices. For these purposes, junctions, invariably rectifying, may be homo- or heterojunction, single crystal or polycrystalline, semiconductor-semiconductor or may correspond with the interface between a semiconductor and another material, such as a conductive metal or an ionically conductive liquid. Regardless of the form of the device in production or the precise form of production or of the details of the quality control apparatus, reliance is placed on a single principle of operation. The principle of operation common to every embodiment relates functional imperfections, generally trapping centers, to the relationship between photovoltaic output (photovoltaic output is used in a broad sense and includes both current and voltage) and wavelength or intensity of irradiating energy. The irradiating energy is electromagnetic radiation having a wavelength between 200 nm and 6000 nm. In the most usual embodiment, two irradiation sources are utilized. The first, generally of relatively high intensity and either broad or narrow band, adds carriers and changes the distribution of carriers between the concerned states including states due to functional imperfections, and the second, of varying wavelength and intensity lesser than that of the first, generates additional carriers which, through some mechanism, result in a photovoltaic output which is sensitive to the population change produced by the first source. A wavelength dependent photovoltaic output as measured at at least one wavelength that deviates from the desired and expected photooutput-wavelength relationship is translated into terms useful for production or process control. This "deviation" is usually evidenced as peaks or valleys and is considered due to functional imperfections that cause either recombination of generated carriers at trapping centers or activation of carriers within trapping centers located in the light absorbing region. The two processes are readily distinguishable as the first occurs at wavelengths equivalent to energies exceeding that of the bandgap and the second, an indirect bandgap mechanism, occurs also at wavelengths equivalent to energies less than that of the bandgap. The deviation may also be evidenced by a reduced photovoltaic output produced by the earlier mentioned second beam at one or more wavelengths, when increasing the intensity of the first.

A preferred embodiment maximizes the signal-to-noise ratio by chopping the low intensity radiation at rates that are invariably slower than the relaxation rates associated with the concerned phenomena.

In a particular preferred embodiment, the photovoltaic detector operates at the chopping frequency. This synchronous arrangement is particularly desirable where the wavelength varying radiation is chopped as the photovoltaic detection sensitivity is improved.

As generally contemplated, procedures of the invention need not be applied to every device. The entire production may oftentimes be effectively monitored by selecting and examining a number of selected devices with the selection process being determined by experience. Monitoring, as contemplated, will involve selecting and examining at least one device after each major change in processing conditions, e.g., after each replenishment of etchants or other chemicals involved and may be more frequent. The measurements can be translated into changes in the processing parameters, such as etching solution or time, that compensate for changes in the etchants and for other and unforeseen circumstances that affect the quality of the junction devices produced. The translation of the monitoring measurements into changes in the processing parameters may be either manual or automatic.

DETAILED DESCRIPTION

Figure 1:
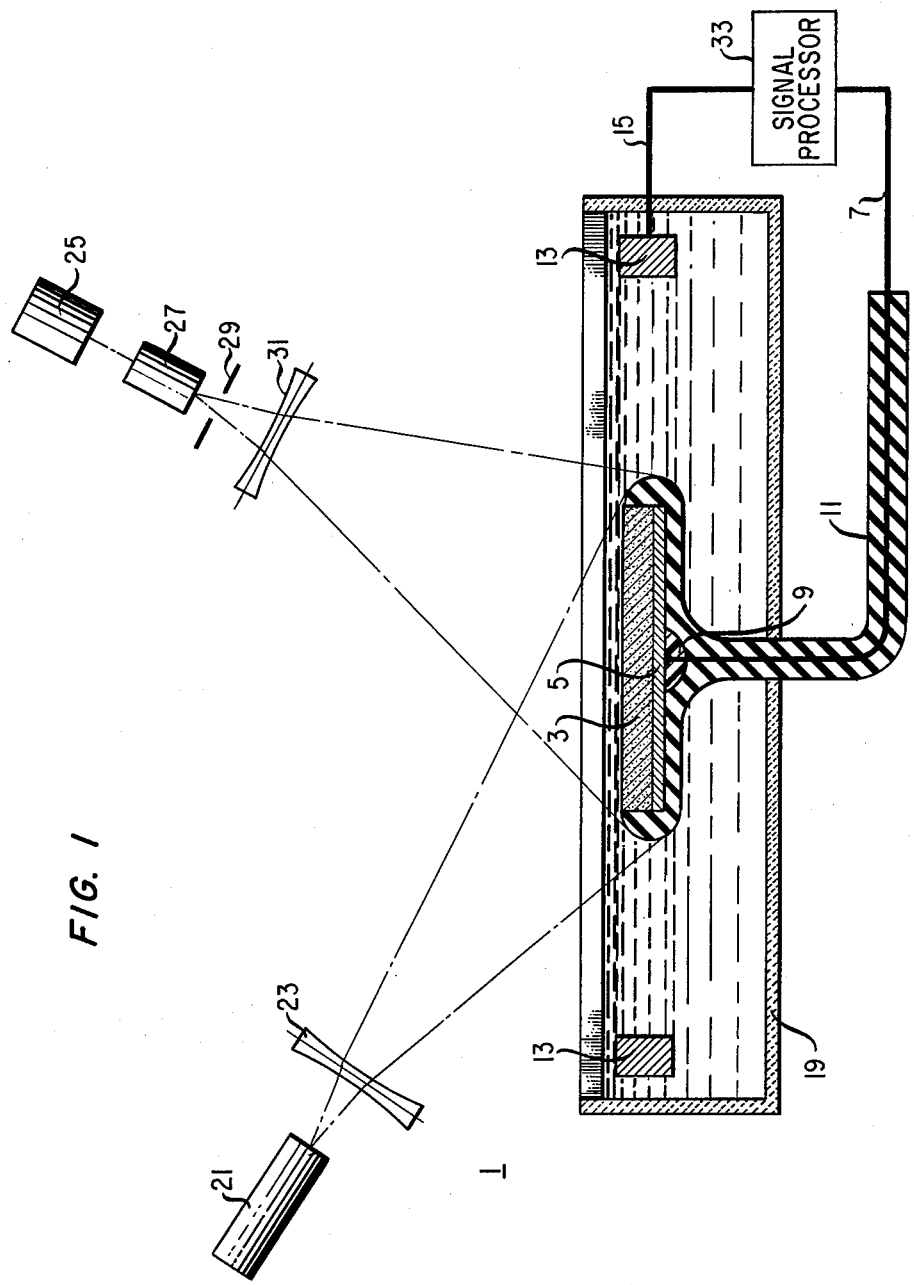
FIG. 1 is a schematic representation of a junction device and associated monitoring apparatus for the practice of the invention.

A junction device and monitoring apparatus suitable for the practice of the invention are schematically shown in FIG. 1. The particular junction device shown is a semiconductor liquid junction photocell 1. The photocell 1 comprises a photosensitive semiconductor electrode 3 having an ohmic contact 5 made to one surface with, e.g., evaporated indium. Typical electrode materials include CdS, CdSe, CdTe and GaAs. Electrical conductor 7 is attached to contact 5 by suitable and well-known means, such as silver resin 9. Insulator 11 seals conductor 7 and insulates all but the face of electrode 3 that will be exposed to incident radiation. Counterelectrode 13, typically circular and surrounding electrode 3, is made from an inert material such as carbon. Conductors 7 and 15, attached to counterelectrode 13, are attached to a conventional signal processor 33 which includes measuring, e.g., current, voltage, etc., and timing apparatus. The active surface of electrode 3 is positioned adjacent a transparent portion of container 19 which is formed from a material inert to the solutions used in the photocells. It is desirable to position electrode 3 as close as practicable to the containing wall to minimize light loss caused by absorption in the solution.

Light source 21 serves to populate the states, due to imperfections, whose presence it is desired to detect. It is of relatively high intensity, i.e., intensity sufficient to change the carrier distribution of the concerned states, and may be either broad or narrow band. If the latter, the particular band selected will depend upon the material of electrode 3 and must have a wavelength with an energy sufficient to change the carrier distribution among the concerned states. Typical light sources include an argon ion laser for CdS electrodes and a helium-neon laser for CdSe electrodes. Lens 23, typically concave and used when source 21 emits into a solid angle too small to illuminate the active surface of electrode 3, spreads the light from source 21 and insures that the entire active surface of electrode 3 is illuminated. Light source 25 modulates light source 21 and is therefore generally of lesser intensity than light source 21. Light source 25 generates additional carriers which, by some mechanism, result in a photovoltaic, either voltage or current, output with a wavelength dependence sensitive to the population change produced by the source 21 and thus indicative of the presence of functional imperfections. A typical source 25 is a broadband emitter such as a tungsten halogen lamp. The beam from source 25 is focused on monochromator 27 which varies the wavelength and permits measurement of the relative photoresponse as a function of wavelength. In a preferred embodiment, the light exiting from monochromator 27 goes through a conventional chopper 29 which has a chopping frequency slower than the relaxation rates associated with the concerned states. Chopping frequencies are desirably within the range extending from 2 Hertz to 3000 Hertz, although higher frequencies can be used. The chopper, by time varying the intensity of the less intense sorce, increases the signal to noise ratio at the photodetector. The detection sensitivity may be further improved with conventional timing apparatus that permits the photodetector to operate at the chopping frequency. This synchronous detection method also serves to reject the unchopped radiation from source 21. A typical chopper frequency is 100 Hertz. Lens 31 serves to focus the light beam within the active surface of electrode 3 illuminated by source 21.

The current photoresponse spectra were measured under short circuit dc load conditions. The raw data for each spectrum was corrected for the number of photons reaching the semiconductor electrode at the various wavelengths investigated and normalized to unity at their maxima of the desired spectra. The photoresponse spectra thus represent relative quantum yields or relative photoresponse.

An alternative way of using the same equipment is to use the chopped beam from source 25, monochromatic or polychromatic but weak relative to the beam from source 21, and measure the output with and without the unchopped radiation from source 21. The wavelength for the chopped source is chosen to maximize the difference in output when the intense beam is on or off.

Figure 2:
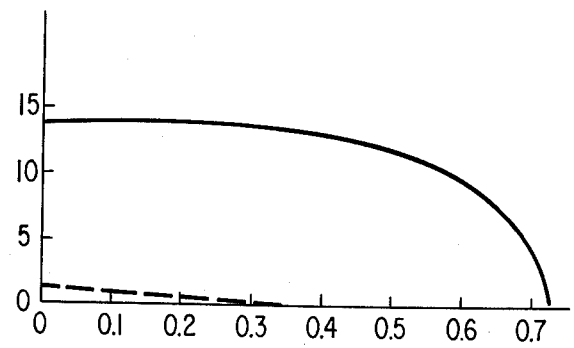
FIG. 2, on coordinates of current density, on the ordinate, and cell voltage, on the abscissa, contains curves for a particular photovoltaic cell structure which relate these parameters in one instance for a cell characterized by a significant number of output-affecting defects and, in the other instance, for such a cell in which such defects have been minimized.

FIG. 2 contains curves relating current density in ma/cm$^2$, on the ordinate, and cell voltage in volts, on the abscissa, for a first cell, represented by the dashed curve, characterized by a significant number of output affecting defects and for a second cell, represented by the solid curve, in which the number of these defects has been minimized with suitable variations in processing conditions. For both cells the semiconductor electrode material was single crystal CdSe and the liquid portion of the junction was formed by a polysulfide redox couple having a nominal 1 molar concentration and a NaOH solution having a nominal 1 molar concentration. Light source 25 was a tungsten-halogen lamp which has, after passing through a monochromator, a known spectral distribution. The number of defects in the cell which had a significant number of such defects was minimized by etching for approximately 10 to 40 seconds in a 4:1 HCl:HNO$_3$ solution. The etched electrode cell has an AM2 (air mass two) efficiency of 7.5% and the unetched electrode all had an AM2 efficiency of 0.05%.

Figure 3:
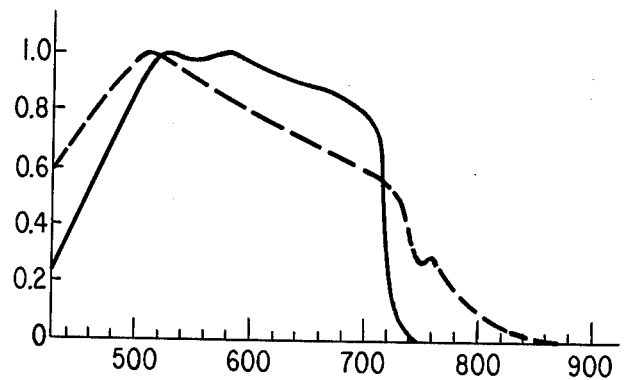
FIGS. 3 and 4, on coordinates of relative photo response, on the ordinate, and wavelength, on the abscissa, contain curves on the basis of which a comparison is made between the wavelength dependence of the photoresponse for the defect containing and the defect minimized cells of FIG. 2; and FIG. sets 5–7 and 8–10 correspond with FIG. sets 2–4 and contain corresponding information for alternative cell designs.
Figure 4:
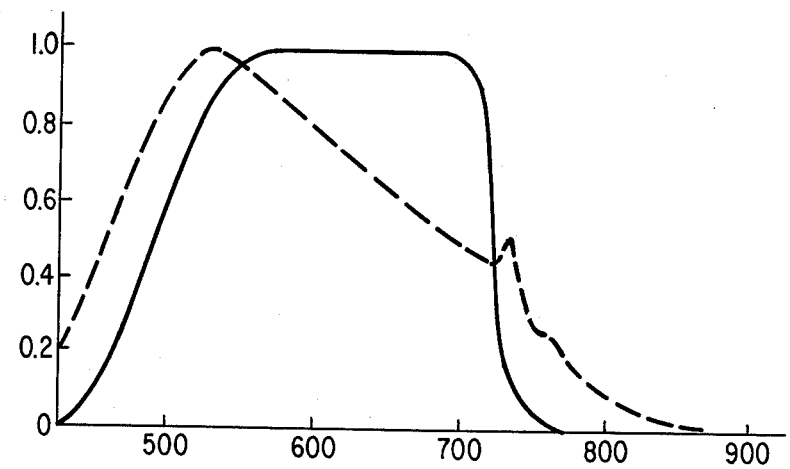

The relative increase in photocell efficiency as processing conditions are altered may be determined by reference to FIGS. 3 and 4. FIGS. 3 and 4 relate the relative photoresponse, on the ordinate, and normalized as previously described for the photocells of FIG. 2 and the wavelength, in nm, of irradiating light, on the abscissa, under different illumination conditions. In both figures, the solid line again represents the etched or defect minimized electrode cell and the dashed line again represents the unetched electrode cell. In both FIGS. 3 and 4, the cells were illuminated with controlled monochromatic radiation from a 3150° K tungsten-halogen standard lamp, corresponding to source 25, and a monochromator 27. Source 25 was chopped at a frequency of 100 Hertz at the input slit of the monochromator. The liquid solutions for the cells in FIGS. 3 and 4 were the same as for the cells in FIG. 2. The cells in FIG. 4 were also illuminated with a He-Ne laser, corresponding to source 21, and irradiating the cell with approximately 60 mw/cm$^2$ at 632.8 nm. The etched CdSe electrode cells in both FIGS. 3 and 4 show a sharp band edge at 727 nm and a relatively flat response extending down to the uncorrected region of polysulfide absorption. The cells with the unetched electrodes, i.e., those with a significant number of defects, have photoresponse spectra displaying shoulders at 757 nm in both FIGS. 3 and 4, and when illuminated with the He-Ne laser, a very pronounced peak at 732 nm as shown in FIG. 4. The unetched electrode cells do not display a flat relative photoresponse at any point below the bandgap energy, but rather have a gradual increase in relative photoresponse down to the polysulfide absorption region.

It is evident that the transitions at 732 nm and 757 nm, which decrease cell efficiency as evidenced by the increase in cell efficiency which follows their removal, are caused by imperfections at or near the CdSe electrode surface because they disappear after a brief etching of the electrode surface. As is well known, surface and near surface defects, regardless of their precise nature, affect the performance of the photocells by introducing states which act as carrier traps or recombination centers. Recombination centers lead to saturation of photocurrents at low light levels and consequently to low cell efficiency. The low efficiency is easily detected by changes in the relative photoresponse spectra for cells with and without defect minimized electrodes both above and within the bandgap as is apparent from FIG. 4. Whether they are electron or hole traps, the traps are either populated by or the population is changed by exposure of the crystal to an intense light beam as minority carriers moving toward the interface or majority carriers moving toward the bulk experience a greatly increased recombination probability. These processes also account for the shapes of the photoresponse spectra for unetched electrodes. Light of relatively short wavelength is absorbed closer to the surface than is the longer wavelength light and is therefore absorbed in a region where the density of traps is high. The resulting high recombination probability results in the cell producing either essentially no or lesser amounts of photocurrent. Light near the band edge penetrates beyond the surface to the more perfect interior regions where little recombination takes place. Consequently, substantial photocurrent is produced by light near the absorption edge. As can be seen from the spectra, the quality or efficiency of cell produced can be easily monitored by examining the photoresponse spectrum of a cell at a selected wavelength or combinations of wavelengths, e.g., 680 nm or 600 nm and 732 nm for a CdSe cell. If two or more wavelengths are examined, the ratio of the relative photoresponses is indicative of the cell quality as is apparent by, e.g., comparing the ratios of the relative photoresponse at 600 nm and 732 nm for the etched and unetched electrode cells. When only one wavelength is examined, the intensity of the intense radiation must be constant, or allowance must be made for variations before the comparison is made. As is apparent, other wavelengths or combinations are also possible and easily selected. The examination may be performed manually or with conventional measuring apparatus.

Figure 5:
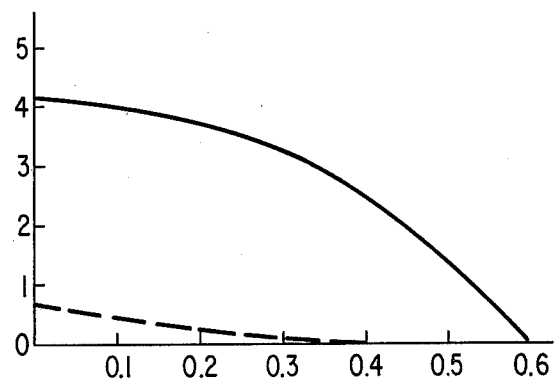
Figure 6:
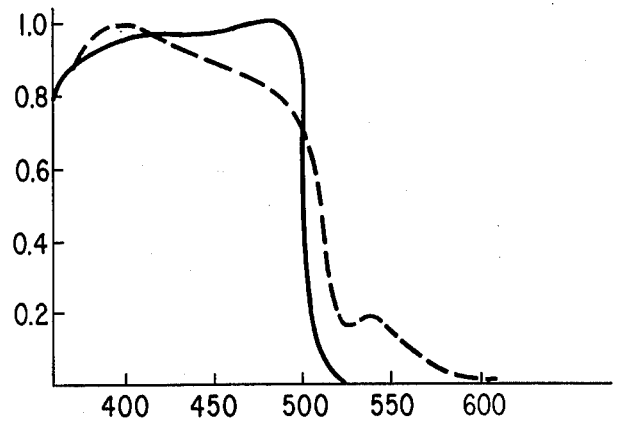
Figure 7:
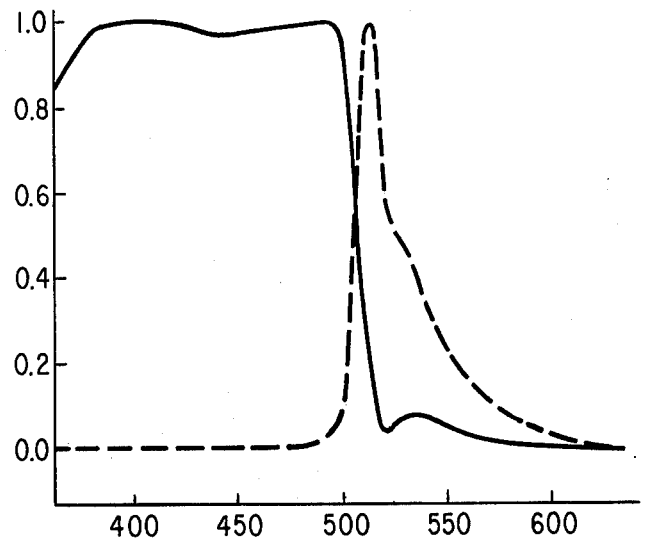

The particular wavelength or wavelengths which may be monitored to ascertain if processing conditions are optimum depend upon the electrode material. This is illustrated by reference to FIGS. 5-7 which correspond to FIGS. 2-4 and have the same coordinates and same conventions regarding etched and unetched electrodes, but represent cells with CdS electrodes. The solution was a nominally 0.1M total sulfur sulfide-polysulfide redox couple in a nominally 0.1M NaOH solution. Light source 25 for FIGS. 5-7 corresponds to source 25 in FIGS. 2-4 and was chopped at 100 Hertz for FIGS. 6 and 7. As is apparent from FIG. 5, which is for illumination corresponding to one AM2 sun, approximately 75 mw/cm$^2$, and which relates current density in ma/cm$^2$, on the ordinate, and cell voltage in volts, on the abscissa, the cell with the etched electrode gives considerably better performance, 1.1% as compared to 0.08% than does the cell with the unetched electrode. Etching was for a 10 to 40 second period in concentrated HCl. Source 21 was an argon ion laser irradiating the electrode with 80 mw/cm$^2$ at 488 nm. With the laser off as in FIG. 6, the unetched electrode cell shows a peak in the photoresponse relative to that of the etched electrode cell which shows only a sharp edge at 510 nm to 536 nm. With the laser on, as in FIG. 7, the etched electrode cell has a small peak in the relative photoresponse at 536 nm, while the unetched cell has a sharp edge at 512 nm and a shoulder at 536 nm. That the transitions at 512 nm are due to states at or near the surface is evidenced by their disappearance after a brief etching of the electrode surface. For cells with CdS electrodes, processing conditions, insofar as they relate to the presence or absence of surface or near surface states, can be effectively monitored by examining the relative photoresponse of a cell near 512 nm although, as is apparent from FIG. 7, other wavelengths or combinations of wavelengths might equally well be used. For example, the ratio of the relative photoresponse at 450 nm and 512 nm, large for the etched electrode cell and small for the unetched electrode cell, might be examined.

Figure 8:
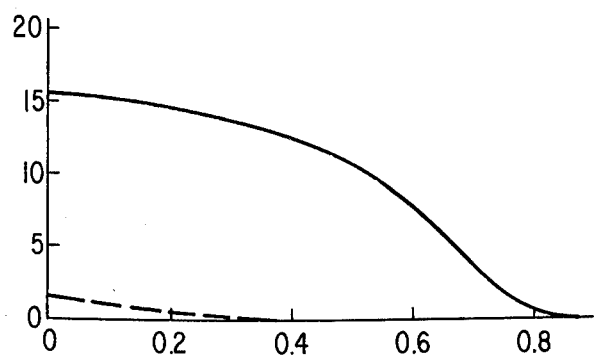
Figure 9:
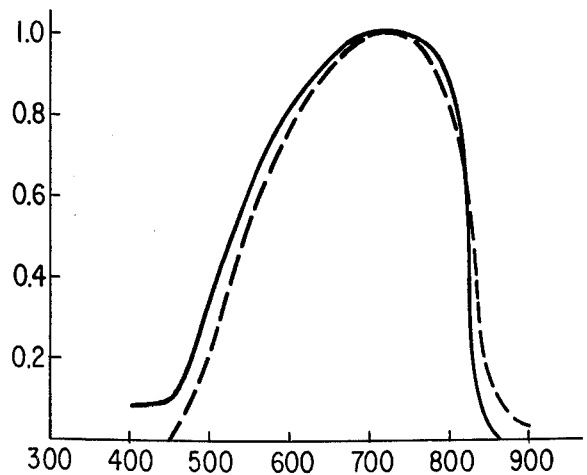
Figure 10:
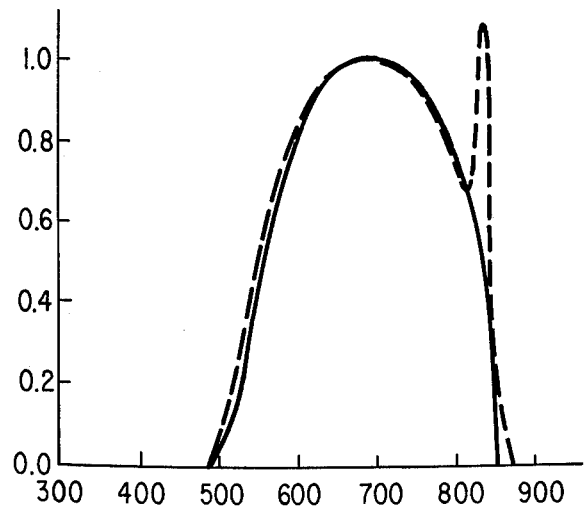

The method of the invention is further illustrated by reference to FIGS. 8-10 which are for cells with single crystal CdTe electrodes. FIGS. 8-10 correspond to FIGS. 2-4 and have both the same coordinates and conventions regarding etched and unetched electrodes as do their corresponding figures. The solution was a nominally 0.9M total selenium selenide-polyselenide redox couple in a nominally 0.1 molar KOH solution. Light source 25 for FIGS. 8-10 corresponds to source 25 in FIGS. 2-4 and was chopped at 100 Hertz for FIGS. 9 and 10. Etching is typically for a period between 10 seconds and 30 seconds, and is done in 1:1:1 mixtures of HCl, $HNO_3$ and saturated $K_2Cr_2O_7$ aqueous solution.

FIG. 8 relates, for illumination corresponding to one AM2 sun, current density in $ma/cm^2$, on the ordinate, and cell voltage in volts, on the abscissa. A cell with an etched electrode had an efficiency of 8.4% and a cell with an unetched electrode had an efficiency of 0.17%.

FIGS. 9 and 10 relate the relative photoresponse, on the ordinate, and the wavelength in nm, on the abscissa. As shown in FIG. 9, the normalized short circuit current photoresponse curves for both the etched and unetched electrode cells, when illuminated with only source 25, show essentially no structure. When also irradiated with source 21, in this case a helium-neon laser emitting 1.8 mw at 632.8 nm, the normalized short circuit current photoresponse spectra, as shown in FIG. 10, for the etched and unetched electrode cells differ markedly with the latter spectrum showing structure. The cell with the unetched electrode has a sharp peak at 820 nm which the cell with the etched electrode does not exhibit. This peak is attributable to surface or near surface states as it disappears after a brief etching of the electrode surface. The quality of the cells with CdTe electrodes may be easily monitored by examining the normalized short circuit current photoresponse near 820 nm and comparing with the photoresponse expected or by selecting several wavelengths, e.g., 820 nm and 700 nm, and examining the ratio of the relative photoresponse. The quality may also be monitored by measuring the photovoltaic output due to the chopped beam with and without the chopped beam.

Although the monitoring process of the invention has been described with respect to liquid junction photocells having CdSe, CdS or CdTe electrodes, it is equally applicable to liquid junction photocells using other materials, e.g., GaAs or $Bi_2S_3$, as the electrode material. Similarly, although the embodiments described monitor semiconductor junction devices used as solar cells, the method of the invention is equally applicable to types of other junction devices in which functional imperfections at or near an interface may affect performance.

The intensity of light source 21 is not crucial to the method of the invention. Intensities as low as 1 $mw/cm^2$ may be used. Below this intensity, the ratio of light source 21 to the modulating amplitude of light source 25 begins to approach unity and the presence of light source 21 becomes of little importance. The intensity from source 25 incident on the electrode surface is desirably as small as is consistent with usable signl-to-noise ratios and is typically less than 1 $mw/cm^2$ at any wavelength setting of the monochromator. The maximum amount of energy that the junction device can dissipate before melting or boiling the solution interface imposes the practical upper limit on intensity from source 21.

In practicing this invention, every junction device produced need not be examined to maintain the quality of all devices produced. A device or devices will usually be examined after every change in processing conditions, such as replenishment of etching solutions, and at other times, periodic or not, as determined by experience. After examining the relative photoresponse at the selected wavelengths, appropriate processing changes can be made, if needed, when the measured photovoltaic output indicates that the processing parameters are not optimum and the devices do not have the desired quality. Both the examination of the relative photoresponse and the adjustments or changes, if any, made in the processing parameters after, and in accordance with such an examination, may be made either manually or with well-known conventional automated means. It must be emphasized that the quality of all devices produced may be effectively controlled by this invention.

What is claimed is:

1. A method for production line quality control of junction devices comprising:
   selecting from time to time at least one of said junction devices;
   irradiating said junction device with an intense first light source;
   irradiating said junction device with a second light source; said second light source adaptable to produce light at at least one wavelength;
   measuring the photovoltaic output from said junction device at at least one wavelength, said measured wavelength corresponding to said incident wavelength, said measured photovoltaic output being indicative of the presence of functional imperfections in said junction device;
   comparing said measured photovoltaic output with the desired photovoltaic output; and
   setting the processing parameters for said junction devices in accordance with said comparison.

2. A method as recited in claim 1 in which said second light source is chopped at a frequency less than the relaxation time associated with said functional imperfections.

3. A method as recited in claim 2 in which said frequency is between 2 Hertz and 3000 Hertz.

4. A method as recited in claim 1 in which said selecting step selects at least one of said junction devices after every change in processing parameters of said junction devices.

5. A method as recited in claim 1 in which said measuring step measures said photovoltaic output at at least two discrete wavelengths.

6. A method as recited in claim 5 in which said comparing step compares the ratios of said measured photovoltaic outputs at said wavelengths.

7. A method as recited in claim 1 in which said junction device is a semiconductor liquid junction photocell.

8. A method as recited in claim 7 in which said setting step affects the etching of the surface of said semiconductor.

9. A method as recited in claim 7 in which said selecting step selects at least one junction device after every change in etching solutions.

10. A method as recited in claim 1 in which said second light source is adaptable to produce light with continually varying wavelengths.

11. A method as recited in claim 9 in which said setting step occurs automatically after said comparing step.

12. A method as recited in claim 1 in which said first light source is adaptable to produce light of variable intensity.

13. A method as recited in claim 1 in which said setting step occurs automatically after said comparing step.

* * * * *